(12) United States Patent
Blish, II

(10) Patent No.: US 7,460,369 B1
(45) Date of Patent: Dec. 2, 2008

(54) COUNTERFLOW MICROCHANNEL COOLER FOR INTEGRATED CIRCUITS

(75) Inventor: Richard C. Blish, II, Saratoga, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 13 days.

(21) Appl. No.: 11/756,749

(22) Filed: Jun. 1, 2007

(51) Int. Cl.
*H05K 7/20* (2006.01)

(52) U.S. Cl. .................. 361/699; 257/714; 174/15.1; 165/80.4; 165/104.33

(58) Field of Classification Search .......... None
See application file for complete search history.

(56) References Cited

U.S. PATENT DOCUMENTS

| | | | | |
|---|---|---|---|---|
| 6,253,835 B1 * | 7/2001 | Chu et al. | ................... | 165/80.4 |
| 6,337,794 B1 * | 1/2002 | Agonafer et al. | ............ | 361/690 |
| 6,986,382 B2 * | 1/2006 | Upadhya et al. | ........... | 165/80.4 |
| 7,139,172 B2 * | 11/2006 | Bezama et al. | ............... | 361/699 |
| 7,185,697 B2 * | 3/2007 | Goodson et al. | ........ | 165/104.33 |
| 7,355,277 B2 * | 4/2008 | Myers et al. | ................. | 257/712 |
| 7,414,843 B2 * | 8/2008 | Joshi et al. | ................... | 361/699 |

OTHER PUBLICATIONS

Prasher, Ravi S., et al., "Nano and Micro Technology-Based Next-Generation Package-Level Cooling Solutions," Intel Technology Journal, vol. 9, Issue 4, 2005, pp. 285-296, 14 pages.

Zhang, L., et al., *Silicon Microchannel Heat Sinks: Theories and Phenomena*, Microtechnology and MEMS, Springer-Verlag, 2004, pp. 1-140.

* cited by examiner

*Primary Examiner*—Boris L Chervinsky
(74) *Attorney, Agent, or Firm*—Zagorin O'Brien Graham LLP

(57) ABSTRACT

A plurality of channels are formed in a base, e.g., a substrate of an integrated circuit, each channel extending between edges of the base. Two pairs of manifolds are provided, the first pair communicating with a first group of channels and the second pair communicating with a second group of channels, the first group of channels and the first pair of plena isolated from the second group of channels and the second pair of plena. Each of the pairs of manifolds includes multiple branches coupled to the channels and a common plenum. Cooling fluid is injected into the channels from different sides of the base, causing fluid to flow in different directions in the two groups of channels, the channels in thermal contact with the integrated circuit.

28 Claims, 12 Drawing Sheets

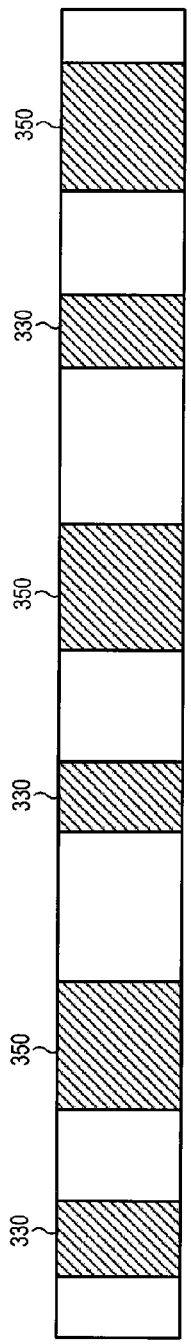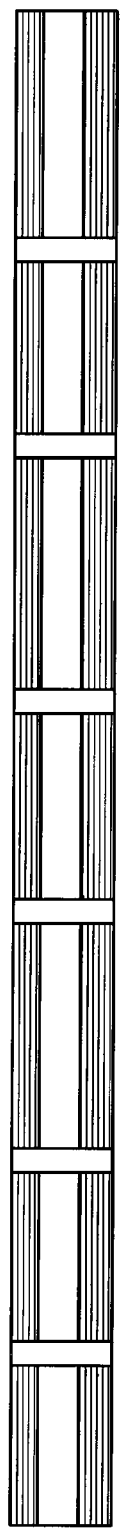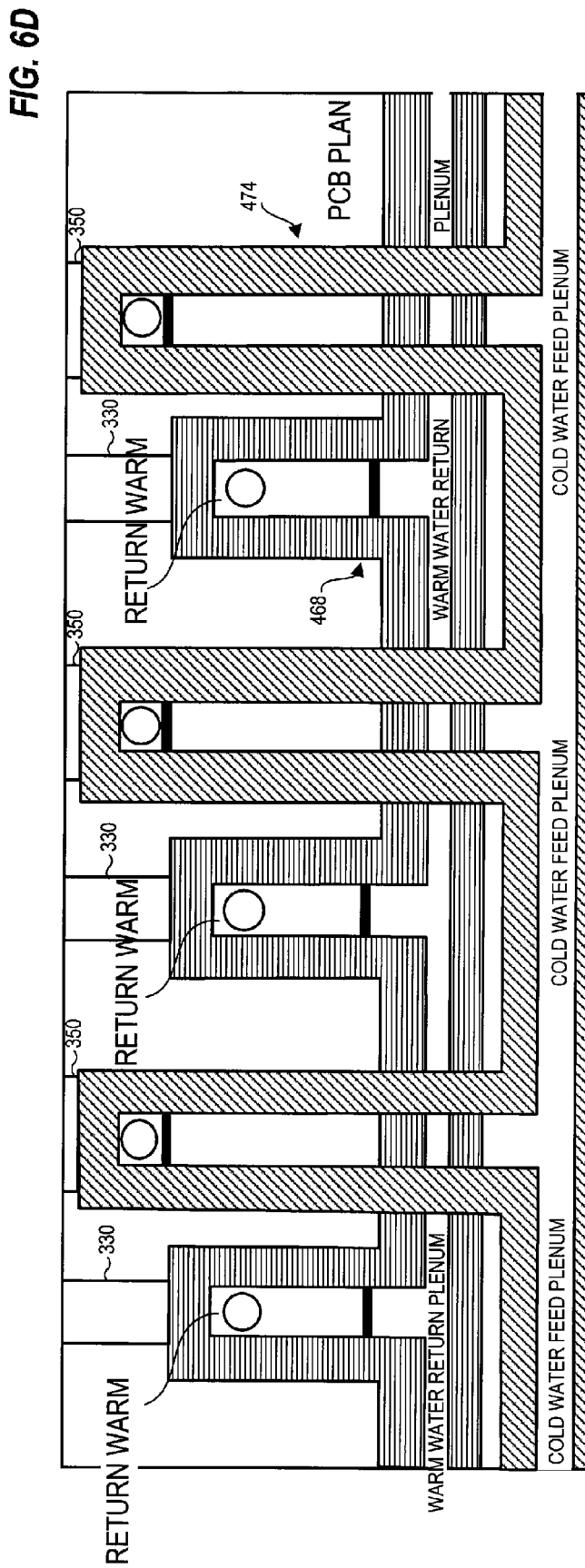

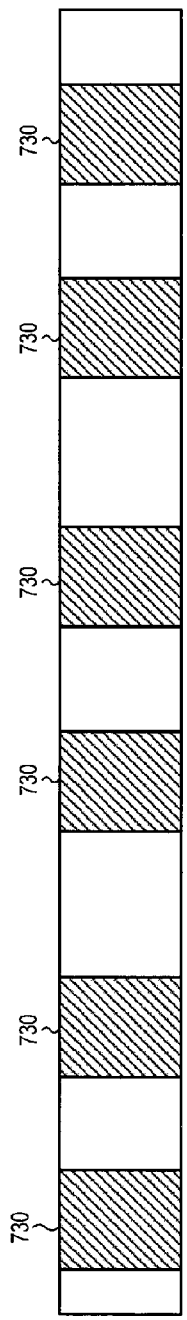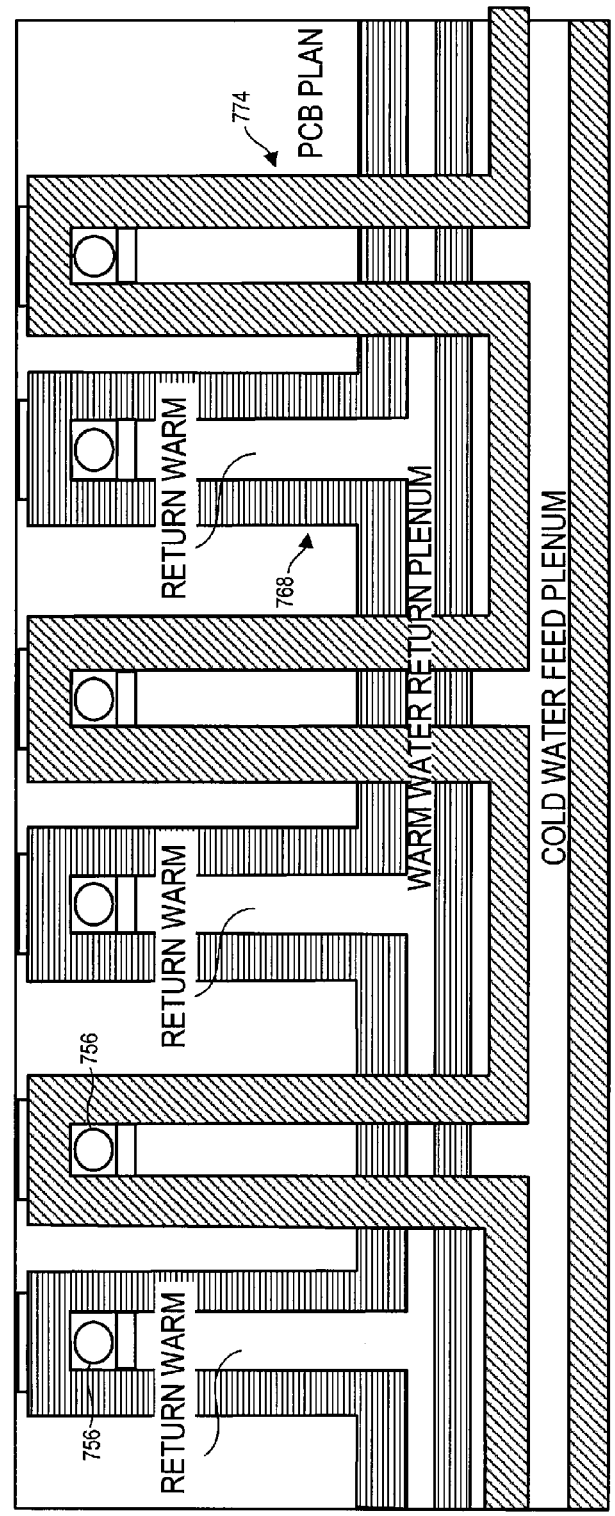

COUNTERFLOW MICROCHANNEL COOLER FOR INTEGRATED CIRCUITS

BACKGROUND

1. Field of the Invention

This invention relates to cooling integrated circuits and more particularly to microchannel coolers for integrated circuits.

2. Description of the Related Art

Much of the power consumed by a modern integrated circuit (IC) during operation is dissipated as heat, increasing the temperature of the IC and altering its properties. For example, silicon switching speed is slower when hot. Additionally, reliability is reduced as temperature increases. If the temperature is sufficiently high, irreversible damage occurs. To remove heat as quickly as possible, several approaches have been used in the art. These generally involve mounting heat dissipaters, such as heat sinks, near the IC package.

FIG. 1 shows a cross-sectional view of one such prior art integrated circuit assembly 100. An IC 102 is mounted on a substrate 104 using C4 bumps 106. The package lid 108 sits on the substrate 104 and is thermally coupled to the IC 102 by a first level thermal interface material (TIM) 110. A heat exchanger 112, thermally coupled to the lid 108 by a second level TIM 114, removes heat to the ambient, which may be a gas, e.g., air or dry nitrogen, or a liquid, e.g., water or liquid nitrogen. The entire assembly 100 may be mounted to a circuit board (not shown) by pins 116 or any other convenient mounting mechanism.

As can be seen, this integrated circuit assembly relies on conduction through the thermal interface materials and the package to remove heat from ICs. Since many ICs typically have hotspots, i.e., they are not uniformly heated, that non-uniformity may be transferred largely unchanged through the package to the heat exchanger.

Referring to FIG. 2A, one approach contemplated in the prior art to provide improved cooling is to run a cooling liquid through channels 201 in the semiconductor as shown in FIG. 2A. A problem with the approach shown in FIG. 2A is that as the cool water enters one side 202 of the semiconductor and travels to the other, it loses cooling capacity by absorbing heat from the semiconductor as it travels. In that case, the other end 203 of the integrated circuit will be left with a higher temperature.

One approach to address that problem, shown in FIG. 2B, utilizes stacked channels 205 and 207 with cold water being supplied from two sides of an integrated circuit. As shown in FIG. 2B, cold water is supplied to the channels 205 on the bottom of front side 206 of the integrated circuit, and cold water is also supplied to the top channels 207 on the far side 208 of the integrated circuit. The cold water fed to channels 207 exits as warm water on side 206. Similarly, the cold water supplied on side 206 exits as warm water on far side 208. Thus, in order to deal with the problem associated with FIG. 2A (warm coolant concentrated on one side of the semiconductor), cold water is fed from both sides in FIG. 2B.

A vertical section close to the edge of side 208, and looking into the IC, is shown in FIG. 2C and a vertical section close to edge 206 is shown in FIG. 2D. A plan view of the integrated circuit shows the top channel 207 cold on side 208 and warm on side 206. Note that the transition shown as abrupt in FIG. 2E from cold to warm would, of course, be gradual.

The stacked channel approach shown in FIGS. 2B-2E suffers from the fact that the deep set of channels 205, closest to the heat source (i.e., the active semiconductor), shields the active semiconductor from the second set of channels 207. Further, each channel will have a "cold" end and then get warmer as the conduit crosses to the other side. Thus, some parts of the device are starved of coolant.

In view of the approaches described above, improved cooling approaches are desirable to improve reliability and performance.

SUMMARY

In one embodiment, an apparatus includes a plurality of channels formed in a base, each channel having first and second ends. The channels are substantially parallel to a surface of the base and run from a first to a second edge of the base. The apparatus includes a first pair of manifolds, each manifold of the first pair having a plurality of branches and a plenum connected to the branches. A first manifold of the first pair is disposed at the first edge and a second manifold of the first pair disposed at the second edge of the base. The first pair of manifolds are in fluid communication with a first group of the channels. The apparatus includes a second pair of manifolds, each manifold of the second pair having a plurality of branches and a plenum connected to the branches. A first manifold of the second pair is disposed at the first edge and a second manifold of the second pair is disposed at the second edge of the base. The second pair of manifolds are in fluid communication with a second group of channels and isolated from the first pair of manifolds and the first group of channels. The one or more channels of the first group are substantially thermally non-blocking with respect to the one or more channels of the second group of channels in a direction towards a heat source.

In an embodiment, the channels in the first and second group are configured to carry fluid in opposite directions. In an embodiment, the channels of the first group are interleaved with channels of the second group.

In another embodiment, a method is provided that includes causing fluid to flow in a first direction from an inlet end to an outlet end in a first plurality of channels formed in a base, the channels being substantially parallel to a surface of the base and running from a first to a second edge of the base, the first direction being from the first to the second edge of the base; and causing fluid to flow in a second direction from an inlet end to an outlet end in a second plurality of channels formed in the base, the second plurality of channels substantially parallel to the surface of the base and running from the first to the second edge of the base, the second direction being from the second to the first edge of the base, and wherein the one or more channels of the first group are substantially thermally non-blocking with respect to the one or more channels of the second group in a direction towards a heat source.

In still another embodiment, a process for making an apparatus is provided. The process includes disposing one manifold of a first pair of manifolds and one manifold of a second pair of manifolds along a first edge of a base, the base having a first and second group of channels extending from a first to a second edge of the base. A second manifold of the first pair and a second manifold of the second pair are disposed along a second edge of the base, the pairs of manifolds in fluid communication with respective groups of channels. The manifolds are hermetically sealed to the edges of the base along which they are disposed, maintaining fluid communication between first and second pairs of manifolds and respective groups of channels.

BRIEF DESCRIPTION OF THE DRAWINGS

The present invention may be better understood, and its numerous objects, features, and advantages made apparent to those skilled in the art by referencing the accompanying drawings. As is customary in the art, sketches such as those shown in the figures are not to scale, with some features exaggerated to better point out relevant relationships between them.

FIG. 6C shows a plan view of the channels in a base for use with the housing shown in FIG. 6E.

FIG. 6D shows a cross-section of a PCB housing used with the base shown in FIG. 6C.

FIG. 6E shows a sectional view of the housing for use with the base shown in FIG. 6C.

FIG. 7A shows a plan view of the channels in a base for use with the housing shown in FIG. 7C.

FIG. 7B shows a cross section of a PCB housing for use with the base shown in FIG. 7A.

FIG. 7C shows a sectional view of the housing for use with the base shown in FIG. 7A.

The use of the same reference symbols in different drawings indicates similar or identical items.

DESCRIPTION OF THE PREFERRED EMBODIMENT(S)

Figure 1:
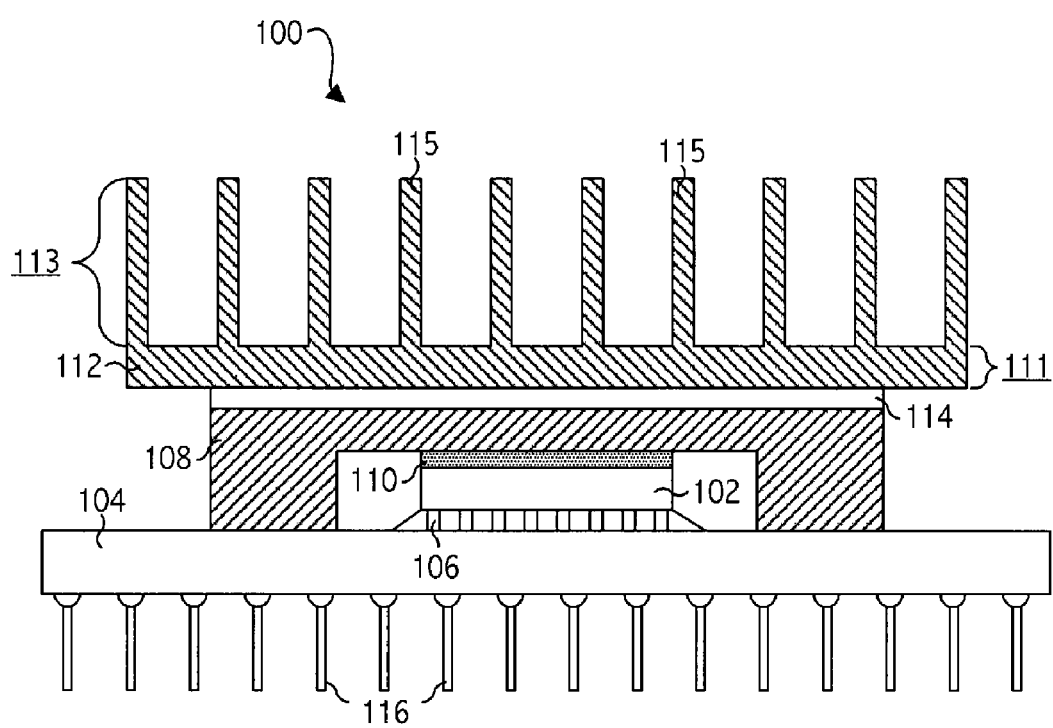
FIG. 1 is a cross-sectional view of a typical integrated circuit assembly.
Figure 2A:
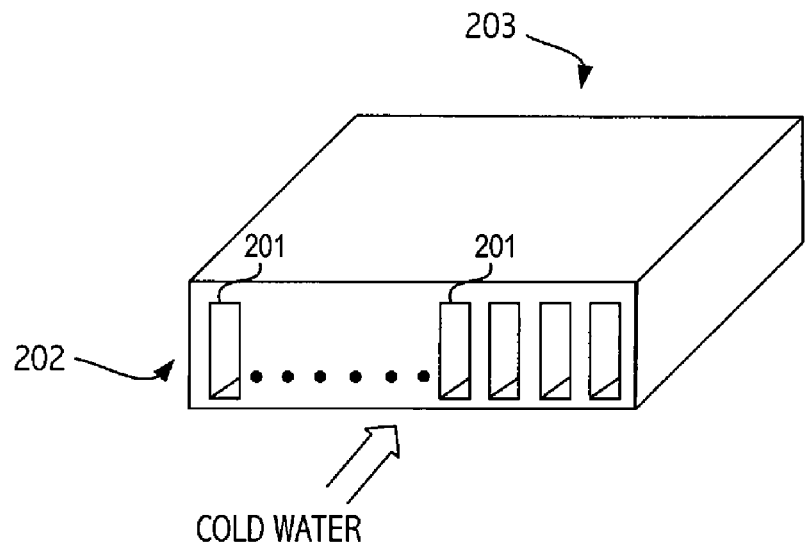
FIG. 2A is a view of a prior art cooling approach.
Figure 2B:
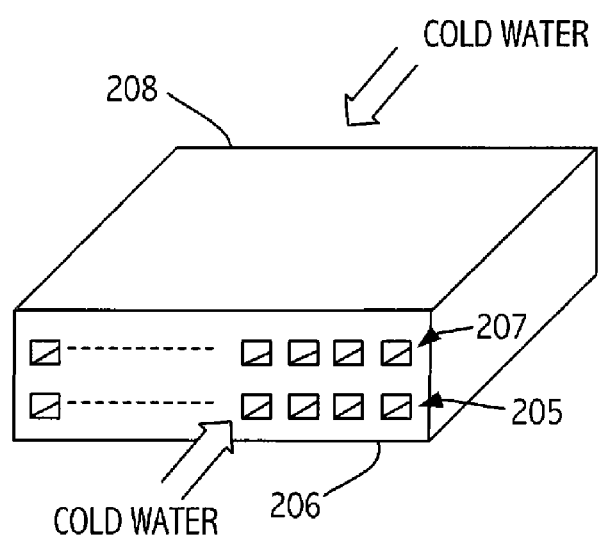
FIG. 2B is a view of another prior art cooling approach.
Figure 2C:
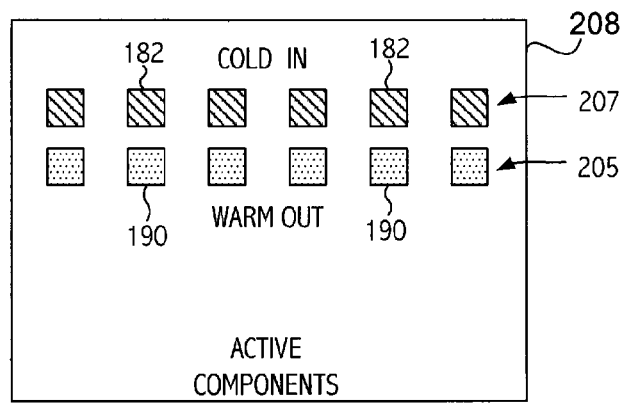
FIGS. 2C and 2D are sectional views of the prior art approach shown in FIG. 2B.
Figure 2D:
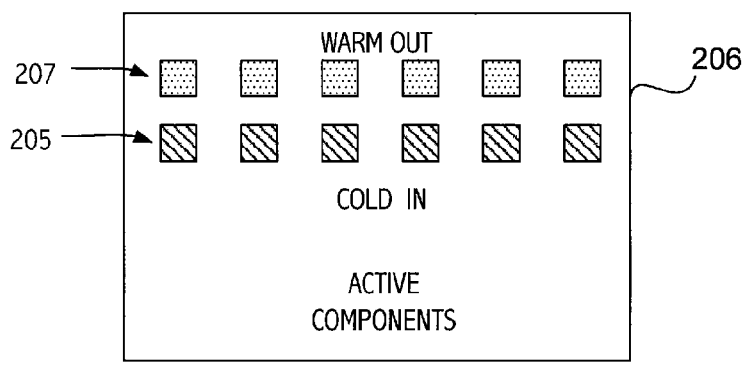
Figure 2E:
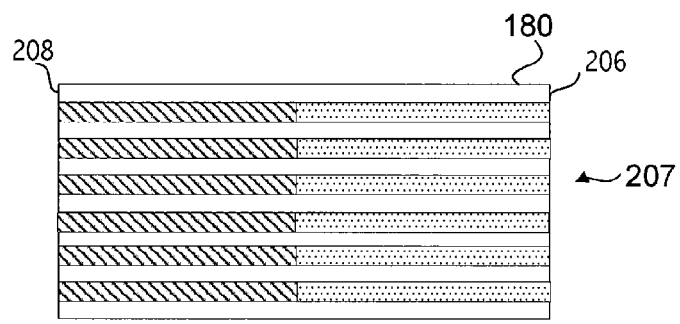
FIG. 2E is a plan view of the prior art approach shown in FIG. 2B.
Figure 3A:
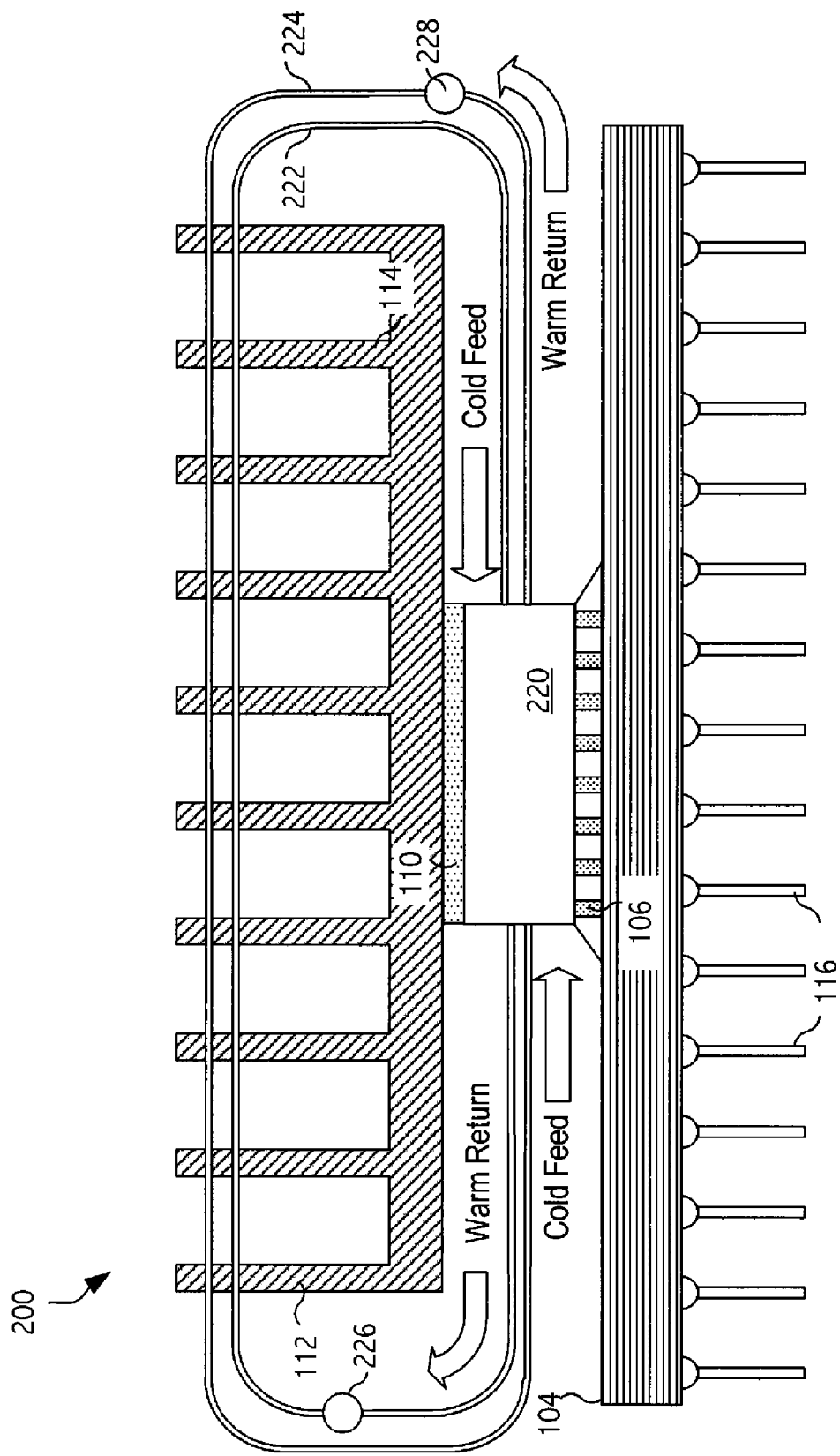
FIG. 3A illustrates a cross-sectional view of a system according to an embodiment of the invention.

In order to address the limitations of the stacked channel arrangement shown in FIGS. 2B-2E, and other prior art cooling techniques, a counterflow microchannel approach is utilized in various embodiments of the invention described herein. Before other details of the counterflow architecture are examined, a high level view of a system incorporating the counterflow architecture will be examined. Accordingly, FIG. 3A shows a cross-sectional view of a simplified IC assembly 200 according to an embodiment of the invention. The embodiment illustrated in FIG. 3A includes a microchannel device 220 that includes an integrated circuit as described further herein. In the particular embodiment of FIG. 3A, two coolant lines 222, 224 feed cold coolant and remove warm coolant to/from the microchannel device 220. The coolant lines 222, 224, carry the warmed fluid to a heat exchanger 112, where the fluid is cooled by exchange of heat with ambient. The cooled fluid then returns through the coolant line 222, 224 into the microchannel device 220 in a closed loop. The direction of the cold feed and warm returns are indicated in the figure for each of the coolant lines. In the embodiment of FIG. 3A, the fluid conduits 222, 224 pass through the exchange portion 113 (identified in FIG. 1) of the heat exchanger 112, here passing between or around the fins 115 (identified in FIG. 1) and making thermal contact with them.

Figure 3B:
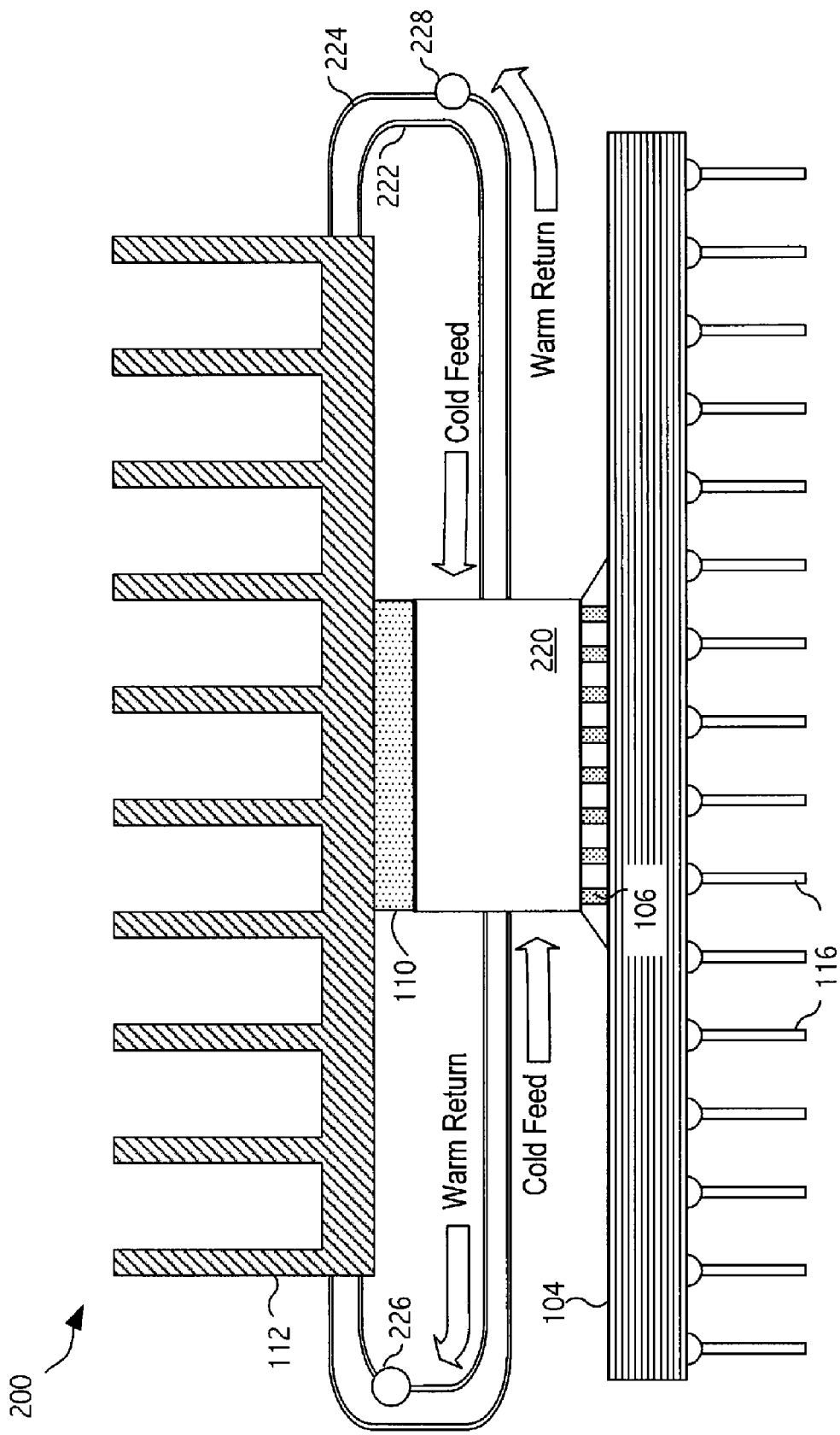
FIG. 3B illustrates a cross-sectional view of a system according to an embodiment of the invention.

In the embodiment of FIG. 3B, the fluid conduits 222, 224 pass through the body 111 (identified in FIG. 1) of the heat exchanger 112, making thermal contact with it. Regardless of the particular configuration employed, heat is exchanged between the conduits 222, 224 and the heat dissipater 112, heating the heat dissipator while cooling the fluid conduits 222, 224 and their contents. Heat exchangers are well known in the art and take many shapes, the particular shape chosen for convenient deployment in a particular application.

Figure 4A:
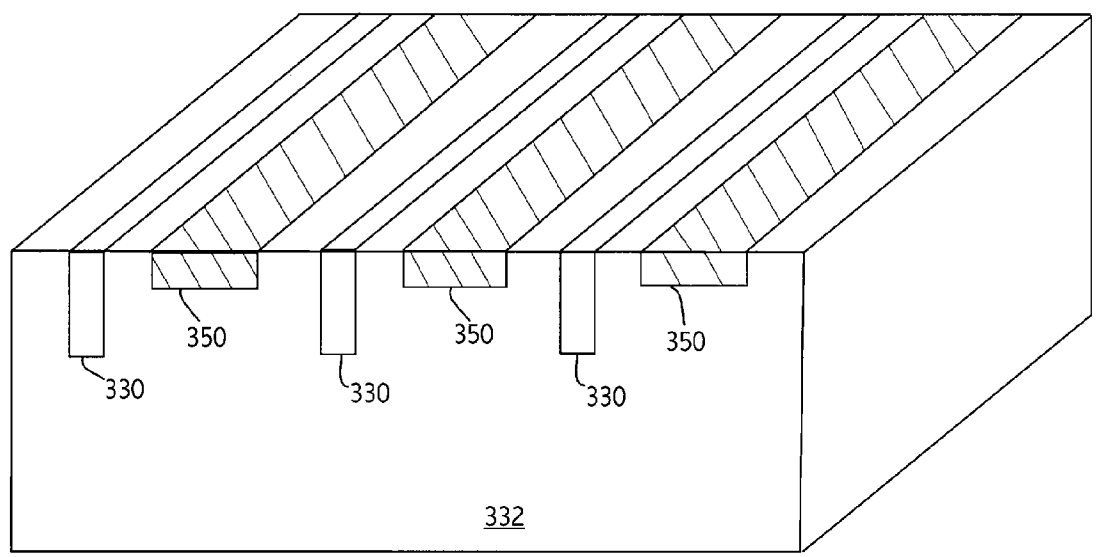
FIG. 4A is a perspective view of microchannels according to an embodiment of the invention.

As stated before, in order to address the limitations of the stacked channel arrangement, a counterflow microchannel approach is utilized in various embodiments of the invention described herein. FIG. 4A is a perspective view of an embodiment of the invention in which microchannels 330 and 350 are formed in a base 332. The series of channels 330, 350 traverse the base between its edges. Channels 330, 350 may be formed in or on the base by a number of techniques, including lithographic procedures common in semiconductor manufacturing, direct etching by ion beams or lasers, scribing, and other methods. As shown in FIG. 4A, the channels are formed on the surface of the base and are of different depths. In an embodiment, as illustrated in FIG. 4A, channels 330 and 350 have equal areas and aspect ratios, with one group of channels oriented at a 90° angle with respect to the other. Channels 330, 350 may have other cross sections, including circular, triangular, trapezoidal, or any convenient shape, and the cross sections need not be the same for both channels 330 and 350. Channels 330, 350 may be formed at the same level (same height in the base 330) or at different levels (different heights in the base 332), and at any height within the base 332, including on its top or bottom surfaces. In the embodiment shown in FIG. 4A, at least a portion of each of the channels are coplanar in a plane parallel to a surface of the base. One key aspect of this embodiment shown in FIG. 4A is that the channels are not blocked from the heat source by other channels.

In an embodiment of the invention, the base 332 is a substrate of a semiconductor device with the active area of the semiconductor displaced from the location of the microchannels. Thus, the microchannels are formed on the backside of the substrate. In one embodiment, the substrate is silicon and the integrated circuit may be formed by any of a number of well known integrated circuit manufacturing techniques. In the embodiment of the microchannels shown in FIG. 4A, adjacent microchannels are assumed to carry coolant in opposite directions as explained more fully herein.

Figure 4B:
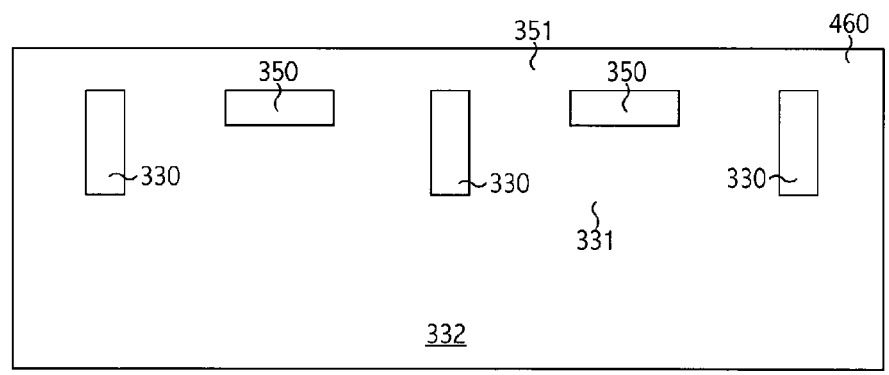
FIG. 4B is a cross-sectional view of the microchannels shown in FIG. 4A.

Referring to FIG. 4B, illustrated is a sectional view of the microchannels according to an embodiment of the invention. In an embodiment such as shown in FIGS. 4A and 4B, the base 332 is silicon, while in other embodiments, the base could be made of glass, quartz, polymeric material, metal, or any of a number of materials appropriate to the application.

Furthermore, the base need not be monolithic as shown in FIG. 3, but may be made up of several layers, and channels may be formed between layers or atop the final layer as depicted. As stated above, the base may be formed integrally with the IC itself, for example, on the back of the IC substrate. The base 332 is preferably formed of a material resistant, over the lifetime of the device, to corrosion by the fluid employed, although accommodations for other materials can be made by those skilled in the art. Note that at least a portion of each of the microchannels 330 and at least a portion of each of the micro channels 350 in FIG. 4B are co-planar, in a plane parallel to the surface of the base. In other embodiments, they may be fully coplanar (see FIGS. 7A-7C).

Figure 5A:
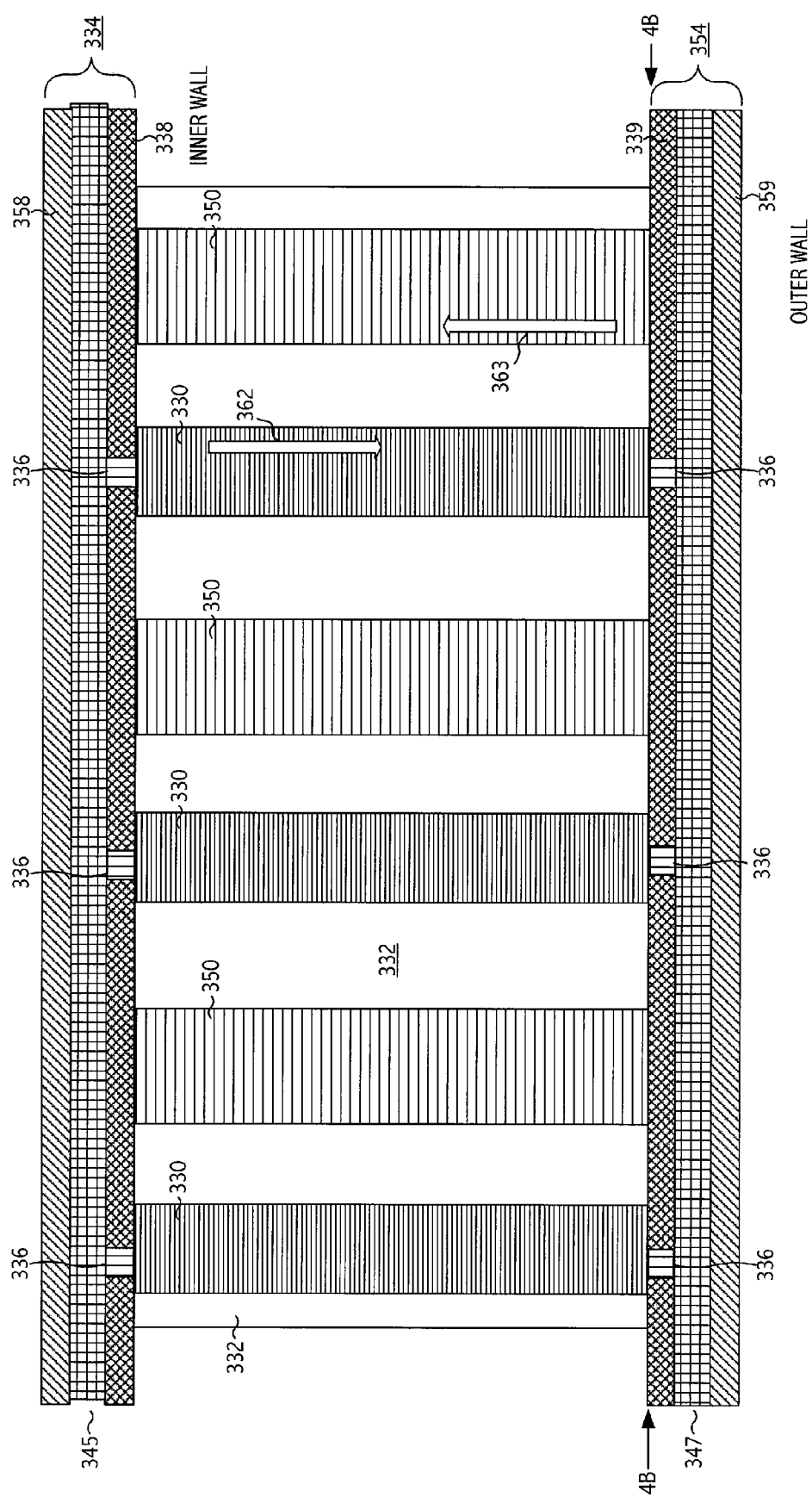
FIG. 5A shows a plan view of microchannels and a sectional view of housings according to an embodiment of the invention.

Referring now to FIG. 5A, housings 334, 354 are shown to be disposed at opposite edges of the base 332. The cross-sectional view of the housings is in a plane parallel to the surface of the base. At the particular depths shown, channels 330 are shown to communicate with the interior of the housings 334, 354 through a series of vias 336 through the inner housing walls 338, 339 at each end of the channels 330, 350. Walls 345, 347 provide the sealing layer for the vias 336. Although depicted in FIG. 3 as running across the base 332 from one edge to the opposite edge in parallel to each other, the channels 330, 350 may take other non-intersecting paths in the plane of the assembly.

Figure 5B:
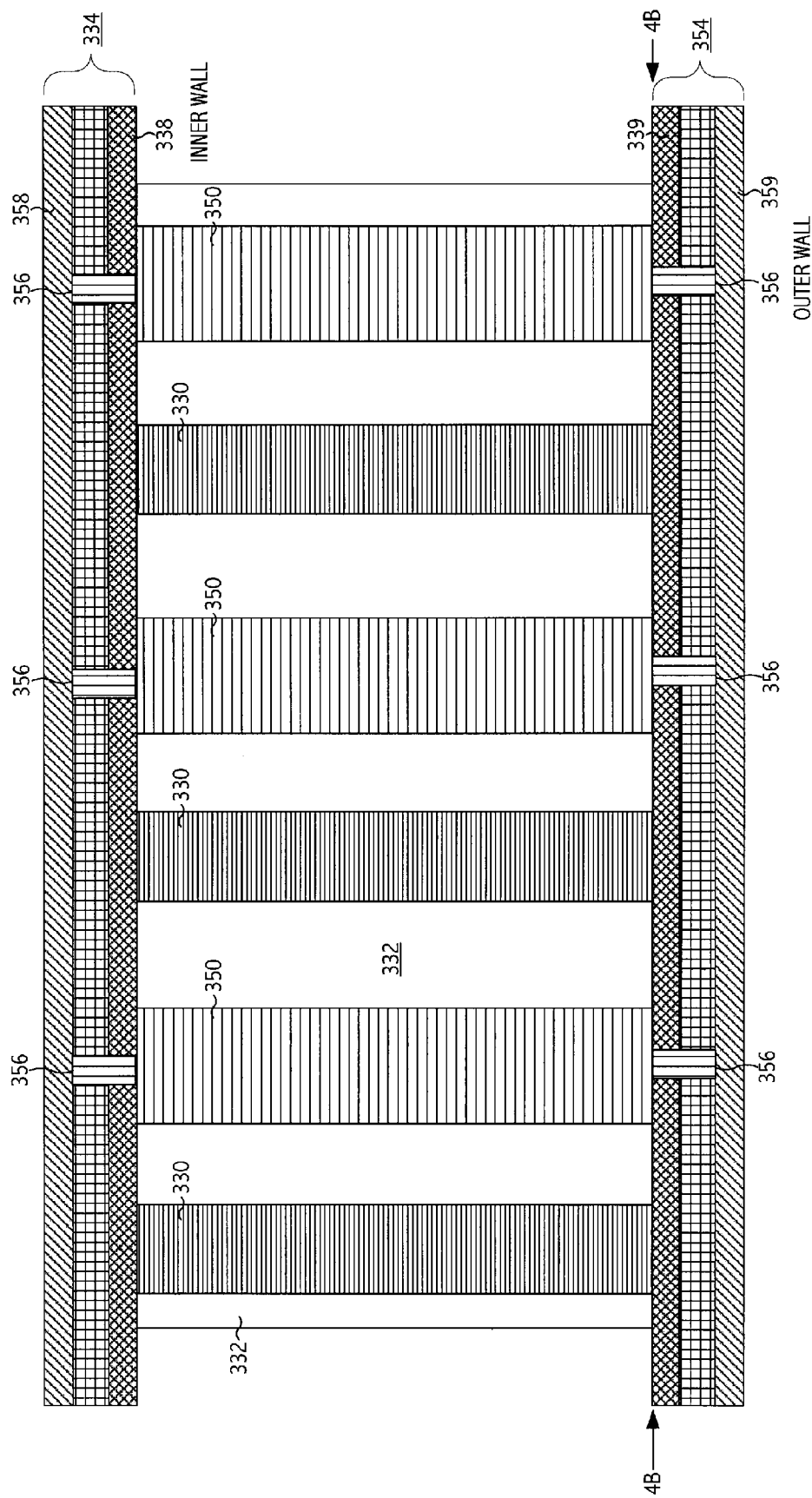
FIG. 5B shows a plan view of microchannels and a sectional view of housings according to an embodiment of the invention.

Referring now to FIG. 5B, a sectional view at a different depth from FIG. 5A shows that channels 350 communicate with the interior of the housings 334, 354 through a series of vias 356 through the inner housing walls 338, 339 at each end of the channels 330, 350. Note that in this embodiment at this depth, the vias 336 are not visible. Outer walls 358, 359 provide the sealing layer for the vias 356.

Referring again to FIG. 4B, the cross-sectional view of the base 332 is seen from the edge along line 4B of FIGS. 5A and 5B showing the channels 330, 350. The cap 460 seals the channels 330, 350 that are formed on the surface of the base 332. Alternative sealing mechanisms may be employed, for example, an organic sealant, a TIM or adhesive, or a monolithically incorporated cap layer. In the particular embodiment depicted in FIG. 4B, channels 330 and 350 have equal areas and aspect ratios, with one group of channels oriented at a 90° angle with respect to the other. As stated earlier, channels 330, 350 may have other cross sections. The cross sections and their areas may change throughout the length of the channels 330, 350. It may be advantageous to alter the channel shape throughout its length, for example, making the cross section at the inlet side bigger than the cross section at the outlet side. In an embodiment, in order to accomplish the different cross sectional areas, constant depth is utilized for the channels but the outlet side (hot) side is narrower than the inlet (cool) side, thereby providing a smaller cross section at the outlet side and a larger velocity of coolant at the hot end. The channels 330, 350 may have large or small cross-sectional areas, as appropriate to the application. For example, the cross-sectional areas may range from about 3 micrometers by about 10 micrometers up to about 30 micrometers by 100 micrometers. Thus, the cross-sectional areas may range from about 30 micrometers up to about 3000 micrometers. These particular ranges are exemplary. The aspect ratio of the channels may also vary. For example, in various embodiments, the aspect ratio may range from about 1:1.5 to about 1:10. Of course, other aspect ratios may be used according to the particular application.

The channels may be formed monolithically in the base 332 by scribing, etching techniques such as those used for micro-electro-mechanical structures (MEMS), use of a sacrificial filler material such as in lost wax casting, growing layers over embedded channels or other methods. Capping with a separate material may also form the channels 330, 350. Channels 330 and 350 need not alternate in a one-to-one fashion as shown. For example, two channels 330 may be interleaved between two channels 350, or some other arrangement. However, in a preferred embodiment, the channels 330 and 350 are interleaved. Further, the pitch (and depth) of the channels is much less than the distance to the heat source. In a typical high power microprocessor, the distance from the microchannels to the heat source on the active side of the semiconductor is determined by semiconductor thickness, approximately 0.8 mm. More generally, the substrate may have a thickness, e.g., of 0.5 to 1.5 mm, while the pitch of the channels may range, e.g., from several micrometers to tens of micrometers. Pitch is defined as the lateral size of the channels plus the gap between them. Channel depth may have similar or smaller dimensions than pitch. Having the pitch (and depth) of the channels be much less than the distance to the heat source allows the heat source to see the warm and cold adjacent channels as a dipole and provides better heat management for the integrated circuit.

Figure 6A:
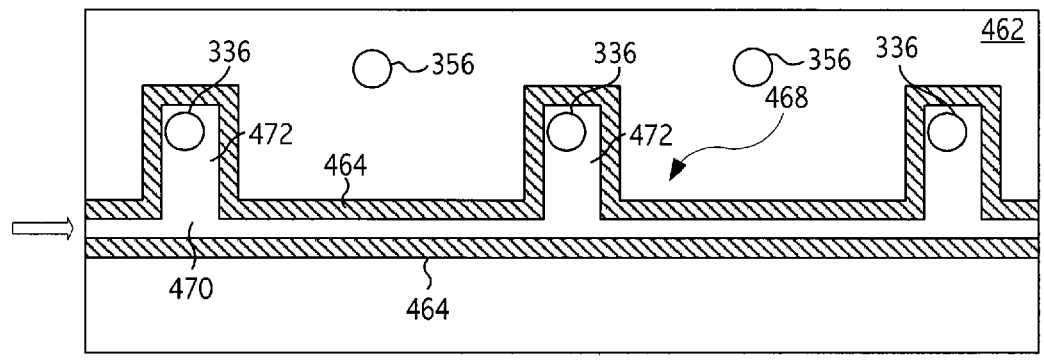
FIG. 6A shows a cross-sectional of a manifold in a housing for supplying or exhausting coolant to/from the channels.
Figure 6B:
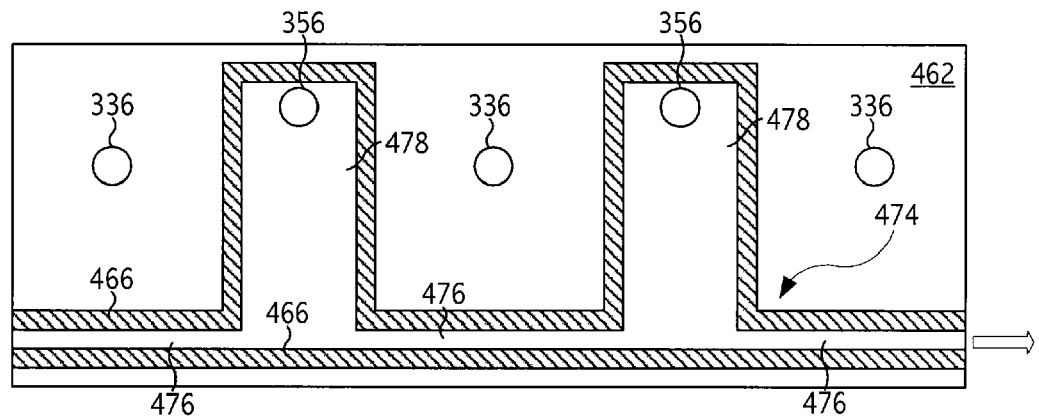
FIG. 6B shows a cross-sectional of a manifold in a housing for supplying or exhausting coolant to/from the channels.

The housings 334 and 354 shown in FIGS. 5A and 5B may be formed of multi-layer printed circuit board (PCB) material. FIGS. 6A-6B show separate layers of an embodiment of a housing 334 made, in this case, of a multi-layer printed circuit board (PCB) material 462 supporting patterned traces of thick copper 464, 466. In FIG. 6A one layer of copper has been formed on a layer of PCB material 462 and patterned. Traces 464 form manifold 468. Manifold 468 includes branches 472 that supply coolant to (or receive coolant from) channels 330 through vias 336. Manifold 468 also includes plenum 470. The plenum 470 is the area common to and supplies (or is supplied by) the branches 468. As used herein, the term manifold may be used to refer to the multiple branch structure formed by branches 468 and also to the overall system formed by the combination of the multiple branch structure and the plenum. The manifold and plenum formed by metal traces 464 allows for confinement of liquid when the PCB layer with the metal traces is capped by formation of the next layer of the housing 334. With the capping of the manifold and plenum, liquid may enter the plenum 470 and then flow into any of the branches 472, and then flow through the vias 336 into the channels 330. In this figure, liquid is injected from the left, although the opposite configuration could certainly be implemented. Assuming that manifold 468 and plenum 470 is formed in housing 334, another similar or identical manifold and plenum would be formed in housing 354. Assuming that manifold 468, used here in the broader sense to include the multiple branches 472 and plenum 470, is the cold feed side, then the manifold opposite (again used in the broader sense) would be the warm exhaust manifold. Assuming liquid is exhausted from the exhaust manifold opposite the inlet manifold on the cold feed side after flowing through the channels 330, only one open end is required, input or exhaust, for each manifold of the pair. Thus, for example, the manifold 468 in housing 334 is an input and the manifold opposite in housing 354 would be an exhaust. The input of the manifold 468 would be coupled to a cold feed conduit 222 and the exhaust of the opposite manifold would be coupled to the warm return (see FIG. 3A).

FIG. 6B depicts the layer of the housing 334 bearing the traces 466 that form the manifold 474 including multiple branches 478 and a plenum 476 for liquid flowing through channels 350. Since the manifold 468 shown in FIG. 6A was assumed to be a cold feed manifold, manifold 474 would be a warm return. Each of the housings 334 and 354 include both a cold feed manifold and a warm return manifold shown in FIGS. 6A and 6B. In FIG. 6B liquid is shown to be exhausted from the plenum 476 to the right. Of course other configurations are possible. Liquid may enter exit branches 478 through vias 356 after flowing through the channels 350. Coolant is supplied to the channels 350 from a similarly constructed or identical manifold in the opposite housing 454. The output of manifold 474 is coupled to the warm exhaust manifold of conduit 224, while the input manifold opposite manifold 474 is coupled to the cold feed portion of conduit 224 (see FIG. 3A).

Full circles in FIGS. 6A and 6B indicate the location of vias 336, 356 to be cut (or drilled or etched, etc.) after all the desired manifolds have been formed, and thus may not be visible at intermediate stages of construction. The vias 336, 356 may also be formed during construction of the housing 334. By confining liquid to separate manifolds with vias communicating with only one group of channels 330 or 350, each group of channels may be isolated from the other group of channels and each group 336, 356 of vias from each other. Furthermore, the two manifolds 468, 474 are separated from each other. This allows isolation of, for example, cool injected liquid from warmed returning liquid, allowing for cold liquid to be supplied from each side providing for a counterflow architecture.

FIG. 6C shows a plan view of the base with channels 330 and 350. FIG. 6D shows a cross section of the printed circuit board forming the housing in FIG. 6E. FIG. 6E shows a plan view of the housing for use with the channels in FIG. 6C, showing both the warm water return manifold and the cold water feed manifold. Assuming the cold feed is feeding into the paper, the cold feed manifold 474 is outside and the warm return manifold 468 is inside (closer to the channels) in the view shown in FIG. 6E. On the opposite side of the channels, the manifolds perform the opposite function (cold feed or warm return) for the channel to which they are coupled. In FIG. 6E, the position of the channels 330, 350 are indicated, with the bottom of the channel indicated by a thicker black line. Note that the channels would not normally be visible in the view shown in FIG. 6E, but are shown to see the appropriate placement of the channels with respect to the housing. Note that only the top vias are shown in the cross section in FIG. 6D. Note also that an appropriate water-proof adhesive should be used to attach the PCB to the base. When attached, the channels are aligned with the vias. In an embodiment, an O-ring (not shown) associated with a conduit such as 222 (FIG. 3A) and a flange are used to feed/return water from each PCB. A clamp may be used to hold the conduit/flange in contact with the PCB.

In the example depicted in FIGS. 4B and 6A-6C, with alternating shallow 350 and deep 330 channels, vias 356 and 336 may be separated by depth. In the more general case, vias 336, 356 may be separated, and so channels 330, 350 isolated by placement of the branches 372, 378. Note that in FIGS. 6A, 6B, and 6E, layers of the housings 334, 354 provide a seal for the vias 336, 356. Layers of the PCB are also used as covers for the manifolds. The number of layers and the material making up the housing is limited only by practicality.

FIGS. 7A-7C illustrate an embodiment in which the vias 756 are at the same depth. As shown in FIG. 7A, a plan view of the base shows that channels 730 have the same cross section from the top, and may also have the same depth, and thus be identical channels. FIG. 7B shows a cross section of a printed circuit board in which the manifolds are disposed. Note that the vias 756 are all visible in this view since they are of the same depth. FIG. 7C shows warm and return manifolds coupled to vias 756 at the same height. The manifolds 774 and 768 are shown as substantially identical but isolated from each other by PCB layers such as shown in FIG. 7B.

Referring back to FIG. 5A, the counterflow architecture is illustrated. Arrows 362 and 363 illustrate the opposite direction of cold fluid flow for two adjacent channels 330 and 350. That pattern may be repeated for all the channels. Referring to FIGS. 3A and 3B, the device 220 includes, e.g., an integrated circuit with microchannels in combination with PCBs on each side providing intake and exhaust manifolds. Still referring to FIGS. 3A and 3B, inner 222 and outer 224 fluid conduits may be connected to mutually isolated pairs of manifolds (each including multiple branches and a plenum) through the housings. For example, inner conduit 222 may supply plenum 470 in manifold 468 in housing 334 and exhaust fluid from another plenum in an identical manifold in housing 354, while outer conduit 224 may exhaust fluid from plenum 476 in housing 334 and supply another plenum in an identical manifold in housing 354. These conduits 222, 224 provide a closed loop through which a coolant or other fluid may be circulated. When a greater pressure drop or fluid flow rate is desired than can be provided by convection alone, a pump 226, 228 may be interposed between outlets and corresponding inlets. By providing a forced fluid flow, the pump may overcome any extra resistance provided by the conduits. Multiple pumps, each circulating fluid in one of the conduits, or a single pump designed to provide counterflow to both fluids, may be inserted into part of the fluid flow path. Further cooling power may be provided by having a portion of the fluid path through one or both conduits pass through a heat exchanger 112, either literally through the body 111 of the heat exchanger 112, or through an area very close to its body 111 or exchange 113 portion (see FIGS. 3A and 3B). Warmed fluid entering the heat exchange area transfers heat to the heat exchanger, returning to the inlet area at a lower temperature. When combined with the microchannel device, conduits, pump(s), and heat exchanger(s) may provide significant cooling advantages for an IC.

Figure 8:
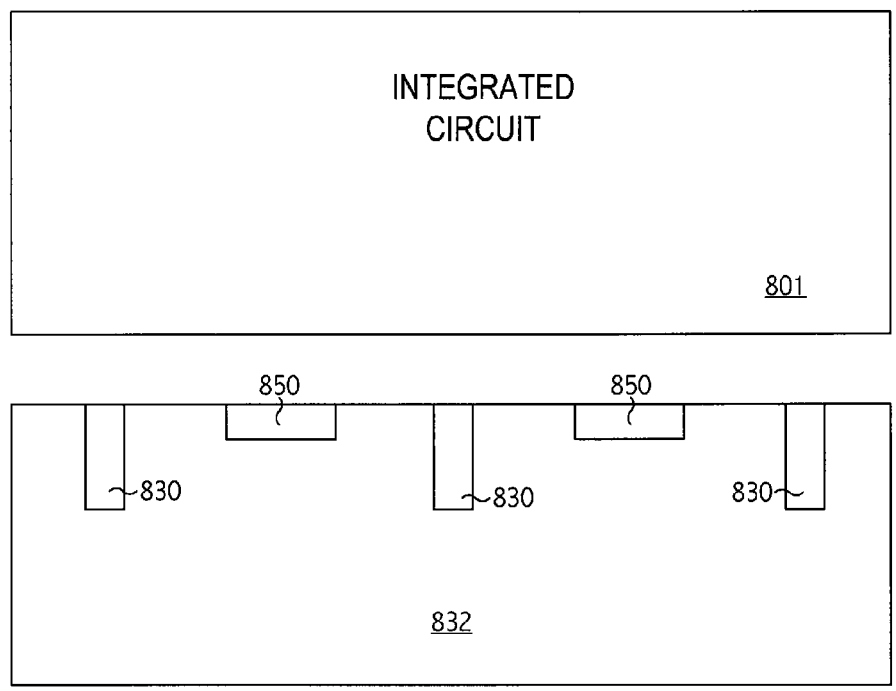
FIG. 8 illustrates an embodiment of a base incorporating microchannels according to an embodiment of the invention.

Referring to FIG. 8, illustrated is an embodiment in which the microchannel device is formed of a base 832 separate from the integrated circuit 801. The channels 830, 850 are formed in the base 832, which may be silicon or other materials described herein. The base is then attached to the integrated circuit 801 by a suitable adhesive. The integrated circuit substrate may serve as a cover for the channels, or another cover may be utilized such as described in association with FIG. 4B. Note that adhesive coupling the semiconductor and the base may need to be sufficiently thin to reduce thermal resistance.

Figure 9A:
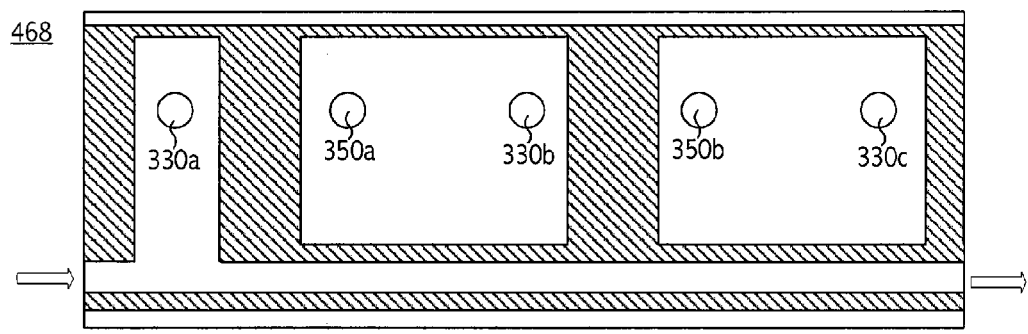
FIGS. 9A and 9B illustrate alternative embodiments of the invention.
Figure 9B:
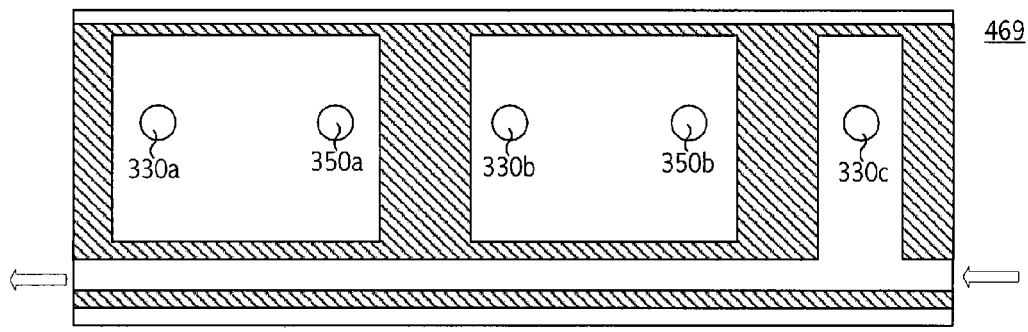

Manifold configurations may be modified or constructed differently to accommodate alternate fluid flow patterns. FIGS. 9A and 9B show a manifold configuration in which cool fluid flows into manifold 468 and into channel 330a and across the base to manifold 469. Note that in the discussion of FIGS. 9A and 9B, the channels are identified by the same reference numerals, e.g., 330a, 350a, etc., as the vias shown in the figures in communication with respective channels. In manifold 469, channel 330a communicates with channel 350a having a different direction of fluid flow. Coolant flows from channel 330a to channel 350a and then back to manifold 468, where it flows into channel 330b and through to manifold 469 and so on. In this configuration, fluid may be injected and exhausted through the same manifold, e.g., manifold 468, or injected into manifold 468 and exhausted from manifold 469 or vice versa. In some embodiments, no manifold is necessary, only an inlet and an outlet, as when the channels are connected at their ends or form a continuous path. Neither in this nor any other configuration need the channels run in a straight line from one edge of the base to the other, but rather may exhibit corners or curves to change their direction, as desirable for the application.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims. Various embodiments of techniques for managing thermal loads in integrated circuits have been described. The description of the invention set forth herein is illustrative, and is not intended to limit the scope of the invention as set forth in the following claims. For example, although the present invention has been described primarily with reference to cooling an IC, it also may be used to heat or maintain a constant temperature in an IC used at cryogenic temperatures. Other variations and modifications of the embodiments disclosed herein may be made based on the description set forth herein, without departing from the scope of the invention as set forth in the following claims.

What is claimed is:

1. An apparatus comprising:
   a plurality of channels formed in a base, each channel having first and second ends, the channels substantially parallel to a surface of the base and running from a first to a second edge of the base;
   a first pair of manifolds, each manifold of the first pair having a plurality of branches and a plenum connected to the branches, a first manifold of the first pair disposed at the first edge and a second manifold of the first pair disposed at the second edge of the base, the first pair of manifolds in fluid communication with a first group of the channels;
   a second pair of manifolds, each manifold of the second pair having a plurality of branches and a plenum connected to the branches, a first manifold of the second pair disposed at the first edge and a second manifold of the second pair disposed at the second edge of the base, the second pair of manifolds in fluid communication with a second group of channels and isolated from the first pair of manifolds and the first group of channels; and
   wherein the one or more channels of the first group are substantially thermally non-blocking with respect to the one or more channels of the second group of channels in a direction towards a heat source.

2. The apparatus as recited in claim 1 wherein at least a portion of each of the channels in the first group and at least a portion of each of the channels in the second group are in a plane parallel to the surface of the base.

3. The apparatus as recited in claim 1 wherein the channels in the first and second group are configured to carry fluid in opposite directions.

4. The apparatus as recited in claim 1 wherein the channels of the first group are interleaved with channels of the second group.

5. The apparatus as recited in claim 1 wherein the base is a substrate of an integrated circuit and the channels are formed in a backside of the substrate.

6. The apparatus of claim 1, wherein the base is attached to a substrate of the integrated circuit.

7. The apparatus as recited in claim 5 wherein channel pitch in the base is between approximately 1 and 30 micrometers and a thickness of the substrate is approximately 0.5 to 1.5 mm.

8. The apparatus as recited in claim 1, wherein channels of the first and second groups have equal aspect ratios.

9. The apparatus as recited in claim 1, wherein channels of the first and second groups have equal cross-sectional areas.

10. The apparatus as recited in claim 1, wherein at least one of the channels has different cross-sectional areas at respective different locations in the at least one channel.

11. The apparatus as recited in claim 1, wherein channels of the first and second groups have cross-sectional areas that range between approximately 30 square microns to 3000 square microns.

12. The apparatus as recited in claim 1, further comprising:
    first and second housings disposed at respective edges of the base, each housing hermetically sealing the manifolds disposed at respective edges of the base.

13. The apparatus as recited in claim 12, wherein the first housing has a first group of vias at a first height to fluidly connect the first manifold of the first pair of manifolds to the first group of channels and a second group of vias at a second height to fluidly connect the first manifold of the second pair of manifolds to the second group of channels.

14. The apparatus as recited in claim 13, wherein the second housing has a first group of vias at the first height to fluidly connect the second manifold of the first pair of manifolds to the first group of channels and a second group of vias at the second height to fluidly connect the second manifold of the second pair of manifolds to the second group of channels.

15. The apparatus as recited in claim 1, further comprising first and second fluid conduits connected to the first and second pair of manifolds.

16. The apparatus as recited in claim 15, further comprising a pump operable to flow a fluid through one or more of the conduits.

17. The apparatus as recited in claim 16, further comprising first and second housings disposed at respective edges of the base, each housing hermetically sealing the manifolds disposed at respective edges of the base.

18. The apparatus of claim 16, further comprising a heat exchanger, at least a portion of each of the first and second conduits in thermal contact with the heat exchanger.

19. A method of managing heat in an integrated circuit comprising:
    causing fluid to flow in a first direction from an inlet end to an outlet end in a first plurality of channels formed in a base, the channels being substantially parallel to a surface of the base and running from a first to a second edge of the base, the first direction being from the first to the second edge of the base;
    causing fluid to flow in a second direction from an inlet end to an outlet end in a second plurality of channels formed in the base, the second plurality of channels substantially parallel to the surface of the base and running from the first to the second edge of the base, the second direction being from the second to the first edge of the base, and wherein the one or more channels of the first group are substantially thermally non-blocking with respect to the one or more channels of the second group in a direction towards a heat source;
    feeding cold fluid from a first manifold disposed at the first edge of the base to the inlet ends of the first plurality of channels;
    exhausting warmed fluid to a second manifold disposed at the second edge of the base from the outlet ends of the first plurality of channels;
    feeding cold fluid from a third manifold disposed at the second edge of the base to the inlet ends of the second plurality of channels; and exhausting warmed fluid to a fourth manifold disposed at the first edge of the base from the outlet ends of the second plurality of channels.

20. The method as recited in claim 19 wherein the base is a substrate of the integrated circuit.

21. The method of claim 19, further comprising isolating the fluid in the first plurality of channels from the fluid in the second plurality of channels.

22. The method of claim 19, further comprising:
causing the fluid from the first plurality of channels to flow from the second manifold into a first fluid conduit; and
causing the fluid from the second plurality of channels to flow from the fourth manifold into a second fluid conduit.

23. The method of claim 22, further comprising:
transferring heat between the fluid in at least one of the first and second conduits and a heat exchanger along the path of the at least one of the conduits.

24. A process for making an apparatus, the process comprising:
disposing one manifold of a first pair of manifolds and one manifold of a second pair of manifolds along a first edge of a base, the base having a first and second group of channels extending from a first to a second edge of the base;
disposing a second manifold of the first pair and a second manifold of the second pair along a second edge of the base, the pairs of manifolds in fluid communication with respective groups of channels; and
hermetically sealing the manifolds to the edges of the base along which they are disposed, maintaining fluid communication between first and second pairs of manifolds and respective groups of channels.

25. The process as recited in claim 24, wherein the base is a back side of a substrate of an integrated circuit.

26. The process as recited in claim 24, wherein the channels of the first and second groups have equal aspect ratios.

27. The process as recited in claim 24, wherein the channels of the first and second groups have equal cross-sectional areas.

28. The process as recited in claim 24, wherein
channels of the first and second groups have cross-sectional areas that range between approximately 30 square microns to 3000 square microns.

\* \* \* \* \*